(12) United States Patent
Choa et al.

(10) Patent No.: US 11,285,453 B2
(45) Date of Patent: Mar. 29, 2022

(54) MOISTURE AND HYDROGEN ADSORPTION GETTER AND METHOD OF FABRICATING THE SAME

(71) Applicant: INDUSTRY-UNIVERSITY COOPERATION FOUNDATION HANYANG UNIVERSITY ERICA CAMPUS, Ansan-si (KR)

(72) Inventors: Yongho Choa, Ansan-si (KR); Nusia Eom, Pyeongtaek-si (KR); Hyoryoung Lim, Ansan-si (KR)

(73) Assignee: INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 0 days.

(21) Appl. No.: 17/073,063

(22) Filed: Oct. 16, 2020

(65) Prior Publication Data
US 2021/0031167 A1    Feb. 4, 2021

Related U.S. Application Data

(60) Division of application No. 16/175,965, filed on Oct. 31, 2018, now Pat. No. 10,843,167, which is a
(Continued)

(30) Foreign Application Priority Data

May 3, 2016    (KR) .................. 10-2016-0054430

(51) Int. Cl.
*H01L 23/26*    (2006.01)
*B01J 20/10*    (2006.01)
(Continued)

(52) U.S. Cl.
CPC ............. *B01J 20/103* (2013.01); *B01J 20/02* (2013.01); *B01J 20/0225* (2013.01); *B01J 20/06* (2013.01);
(Continued)

(58) Field of Classification Search
CPC ........ B01D 2253/1122; B81B 2203/03; B81B 2203/0315; B81B 2203/0323;
(Continued)

(56) References Cited

U.S. PATENT DOCUMENTS 5,888,925 A     3/1999  Smith et al.
7,160,368 B1 *  1/2007  Wakelin ................. B01J 20/041
                                             257/99
(Continued)

FOREIGN PATENT DOCUMENTS

JP      2013-067856 A    4/2013
KR    10-2013-0020792 A  2/2013
(Continued)

OTHER PUBLICATIONS

International Search Report for PCT/KR2016/004745 dated Feb. 21, 2017 [PCT/ISA/210].
(Continued)

*Primary Examiner* — Eric A. Ward
(74) *Attorney, Agent, or Firm* — Sughrue Mion, PLLC

(57) ABSTRACT

A moisture and hydrogen adsorption getter is provided. The moisture and hydrogen adsorption getter includes a silicon substrate including a concave portion and a convex portion, a silicon oxide layer conformally provided along a surface of the concave portion and a surface of the convex portion and configured to adsorb moisture, and a hydrogen adsorption pattern disposed on the silicon oxide layer. A portion of the silicon oxide layer is exposed between portions of the hydrogen adsorption pattern.

7 Claims, 16 Drawing Sheets

Related U.S. Application Data continuation of application No. PCT/KR2016/004745, filed on May 4, 2016.

(51) Int. Cl.

| | | |
|---|---|---|
| *B01J 21/08* | (2006.01) | |
| *B01J 35/00* | (2006.01) | |
| *H01J 7/18* | (2006.01) | |
| *B01J 37/34* | (2006.01) | |
| *B01J 20/02* | (2006.01) | |
| *B01J 20/30* | (2006.01) | |
| *B01J 35/02* | (2006.01) | |
| *B01J 20/06* | (2006.01) | |
| *B01J 20/32* | (2006.01) | |
| *B01J 23/42* | (2006.01) | |
| *B01J 23/44* | (2006.01) | |
| *B01J 37/00* | (2006.01) | |
| *B01J 37/02* | (2006.01) | |
| *G01J 5/04* | (2006.01) | |
| *B01J 23/50* | (2006.01) | |
| *G01J 1/02* | (2006.01) | |

(52) U.S. Cl.
CPC ....... *B01J 20/3071* (2013.01); *B01J 20/3078* (2013.01); *B01J 20/3204* (2013.01); *B01J 20/3236* (2013.01); *B01J 20/3289* (2013.01); *B01J 21/08* (2013.01); *B01J 23/42* (2013.01); *B01J 23/44* (2013.01); *B01J 35/002* (2013.01); *B01J 35/023* (2013.01); *B01J 35/026* (2013.01); *B01J 37/0072* (2013.01); *B01J 37/0215* (2013.01); *B01J 37/347* (2013.01); *B01J 37/348* (2013.01); *H01J 7/18* (2013.01); *H01L 23/26* (2013.01); *B01J 23/50* (2013.01); *G01J 5/045* (2013.01); *G01J 2001/0276* (2013.01)

(58) Field of Classification Search
CPC ...... B81B 2203/033; B81B 2203/0338; B81B 2203/0346; B81B 2203/0353; B81B 2203/0369; B81B 2203/0376; B81B 2203/0384; B81B 2203/0392; G01N 33/005; H01L 21/30604–30621; H01L 23/26; H01L 21/288; H01L 21/31604; H01L 21/31608; H01L 21/31612; H01L 21/31695; B01J 20/10; B01J 20/103; B01J 20/106; B01J 21/06; B01J 21/08; B01J 21/12; B01J 21/14; H01J 7/18–186

See application file for complete search history.

(56) References Cited

U.S. PATENT DOCUMENTS

| | | | |
|---|---|---|---|
| 2004/0061207 A1 | 4/2004 | Ding | |
| 2006/0083896 A1 | 4/2006 | McKinnell et al. | |
| 2010/0290050 A1* | 11/2010 | Uchiyama | B82Y 30/00 356/445 |
| 2011/0115056 A1* | 5/2011 | Baillin | B81B 7/0038 257/617 |
| 2012/0088372 A1* | 4/2012 | Chien | H01L 31/0236 438/753 |
| 2014/0030873 A1* | 1/2014 | Hung | H01L 21/3083 438/478 |
| 2016/0054277 A1 | 2/2016 | Noh et al. | |
| 2016/0175805 A1 | 6/2016 | Catchpole et al. | |
| 2016/0181455 A1 | 6/2016 | Jeong et al. | |
| 2017/0081176 A1* | 3/2017 | Ji | B81B 7/0038 |

FOREIGN PATENT DOCUMENTS

| | | |
|---|---|---|
| KR | 10-2014-0096047 A | 8/2014 |
| KR | 10-2014-0122112 A | 10/2014 |

OTHER PUBLICATIONS

Wet-Chemical Etching of Silicon, MicroChemicals, www.microchemicals.com/downloads/application_notes.html, Nov. 7, 2013, 3 pages.

Razi et al.; "Investigation of hydrogen sensing properties and aging effects of Schottky like Pd/porous Si" Sensors and Actuators B 146 (2010) 53-60 (Year: 2010).

* cited by examiner

MOISTURE AND HYDROGEN ADSORPTION GETTER AND METHOD OF FABRICATING THE SAME

CROSS-REFERENCE TO RELATED APPLICATION

This application is a Rule 53(b) Divisional Application of U.S. application Ser. No. 16/175,965 filed Oct. 31, 2018, which is a Continuation Application of International Application No. PCT/KR2016/004745 filed May 4, 2016, claiming priority based on Korean Patent Application No. 10-2016-0054430 filed May 3, 2016, the disclosures of which are incorporated herein by reference in their entireties.

BACKGROUND

1. Field

The present disclosure herein relates to a moisture and hydrogen adsorption getter and a method of fabricating the same, and more particularly, to a moisture and hydrogen adsorption getter including a silicon substrate, a silicon oxide layer for adsorbing or absorbing moisture, and a hydrogen adsorption pattern for adsorbing or absorbing hydrogen, and a method of fabricating the same.

2. Description of the Related Art

Getters may be used in various electronic devices (e.g., display devices, semiconductor devices, and IR sensors) which requires inner vacuum spaces. In addition, getters have been increasingly demanded with the rapid development of an electronic industry producing electronic devices.

A non-evaporated getter (NEG) has been mainly used as an adsorption getter. However, the NEG may require a process of heating the NEG to a high temperature in an activation process, and thus the NEG may require a separate heat source device therein. Accordingly, there is a limit to the miniaturization of an electronic device. To solve the limitation, various getters are being studied.

For example, Korean Patent Publication No. 10-2014-0096047 (Application No. 10-2014-7011687, Applicant: SAES GETTERS S.p.A.) discloses a composite getter system which includes a NEG material coated with polyimide or a polyimide-based compound to obtain an improved composite getter system.

SUMMARY

The present disclosure may provide a moisture and hydrogen adsorption getter with high reliability, an electronic device including the same, and methods of fabricating them.

The present disclosure may also provide a moisture and hydrogen adsorption getter capable of simplifying processes of forming a silicon oxide layer for adsorbing moisture and a hydrogen adsorption pattern, and a method of fabricating the same.

The present disclosure may further provide a low-cost moisture and hydrogen adsorption getter and a method of fabricating the same.

In an aspect, a moisture and hydrogen adsorption getter may include a silicon substrate including a concave portion and a convex portion, a silicon oxide layer conformally provided along a surface of the concave portion and a surface of the convex portion and configured to adsorb moisture, and a hydrogen adsorption pattern disposed on the silicon oxide layer. A portion of the silicon oxide layer may be exposed between portions of the hydrogen adsorption pattern.

In an embodiment, the silicon substrate may further include a plurality of holes extending downward from the surfaces of the concave portion and the convex portion.

In an embodiment, the silicon oxide layer may be conformally provided along inner surfaces of the holes.

In an embodiment, the moisture and hydrogen adsorption getter may further include a plurality of metal particles provided in the plurality of holes, respectively.

In an embodiment, the metal particles provided in the holes may include at least one of Pt, Ag, or Pd.

In an embodiment, the moisture and hydrogen adsorption getter may further include passivation metal catalyst particles provided on the hydrogen adsorption pattern.

In an embodiment, the passivation metal catalyst particles may include at least one of Ag, Pd, or Pt.

In an embodiment, the hydrogen adsorption pattern may include at least one of PdO, Rh, or Pt.

In an aspect, an electronic device may include a device substrate having a sensor part, and the aforementioned moisture and hydrogen adsorption getter disposed on the device substrate. The sensor part may face the silicon oxide layer and the hydrogen adsorption pattern.

In an aspect, a method of fabricating a moisture and hydrogen adsorption getter may include preparing a silicon substrate including a concave portion and a convex portion, forming a silicon oxide layer for adsorbing moisture by immersing the silicon substrate in an acid solution, and forming a hydrogen adsorption pattern on the silicon oxide layer.

In an embodiment, the method may further include forming a plurality of holes extending downward from surfaces of the concave portion and the convex portion before the forming of the silicon oxide layer.

In an embodiment, the forming of the holes may include forming a metal thin layer on the concave portion and the convex portion, thermally treating the metal thin layer formed on the concave portion and the convex portion to form metal particles, and forming the holes extending downward from the surfaces corresponding to the metal particles by a method of etching the silicon substrate including the concave portion and the convex portion by using the metal particles as a catalyst.

In an embodiment, the preparing of the silicon substrate may include forming a mask film that covers a first region of the silicon substrate and exposes a second region of the silicon substrate, and immersing the silicon substrate in a basic solution to form the concave portion and the convex portion on the second region of the silicon substrate.

In an embodiment, the forming of the hydrogen adsorption pattern may include forming a hydrogen adsorption preliminary pattern on the silicon oxide layer, and oxidizing the hydrogen adsorption preliminary pattern by a thermal treatment method to form the hydrogen adsorption pattern.

In an embodiment, the method may further include forming passivation metal catalyst particles on the hydrogen adsorption pattern. The forming of the passivation metal catalyst particles may include forming a metal catalyst pattern on the hydrogen adsorption pattern, and thermally treating the metal catalyst pattern to form the passivation metal catalyst particles.

DETAILED DESCRIPTION OF THE EMBODIMENTS

Figure 1:
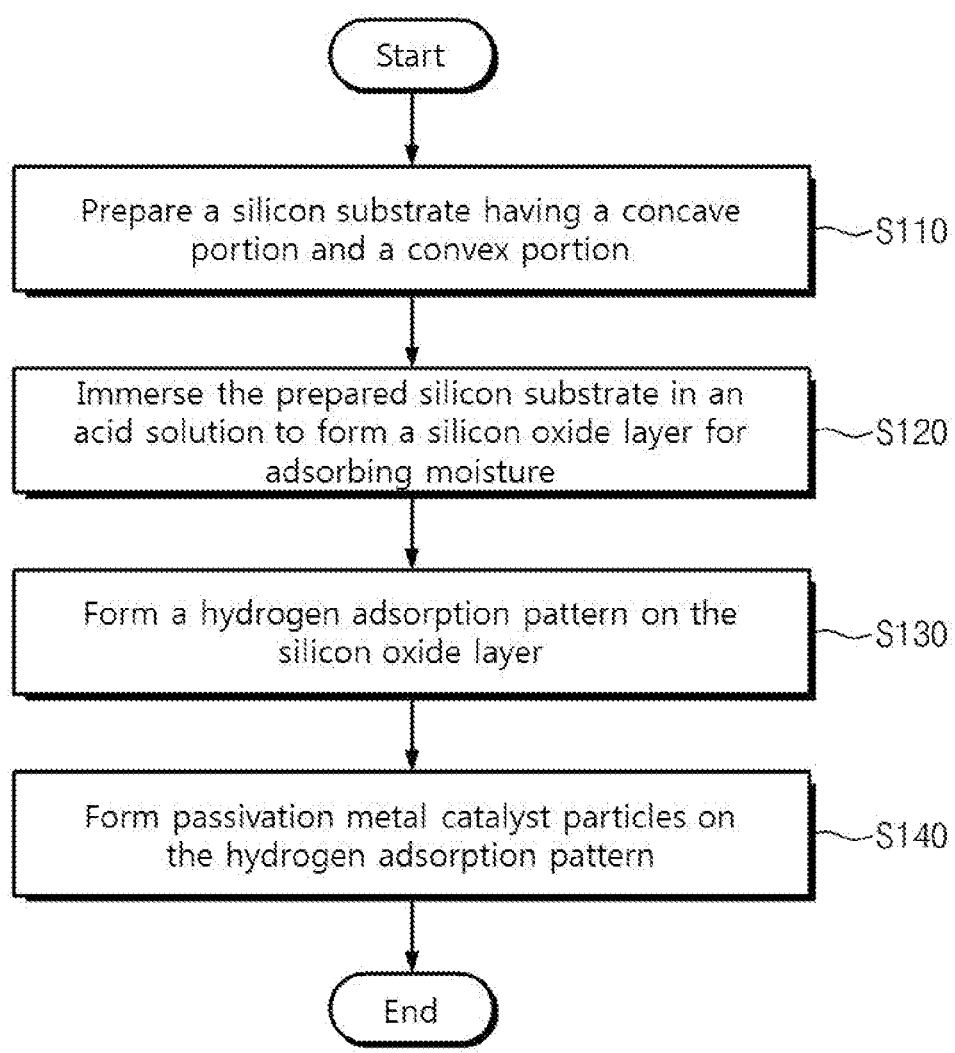
FIG. 1 is a flowchart illustrating a method of fabricating a moisture and hydrogen adsorption getter according to some embodiments of the inventive concepts.

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

A method of fabricating a moisture and hydrogen adsorption getter according to some embodiments of the inventive concepts will be described hereinafter.

Figure 5:
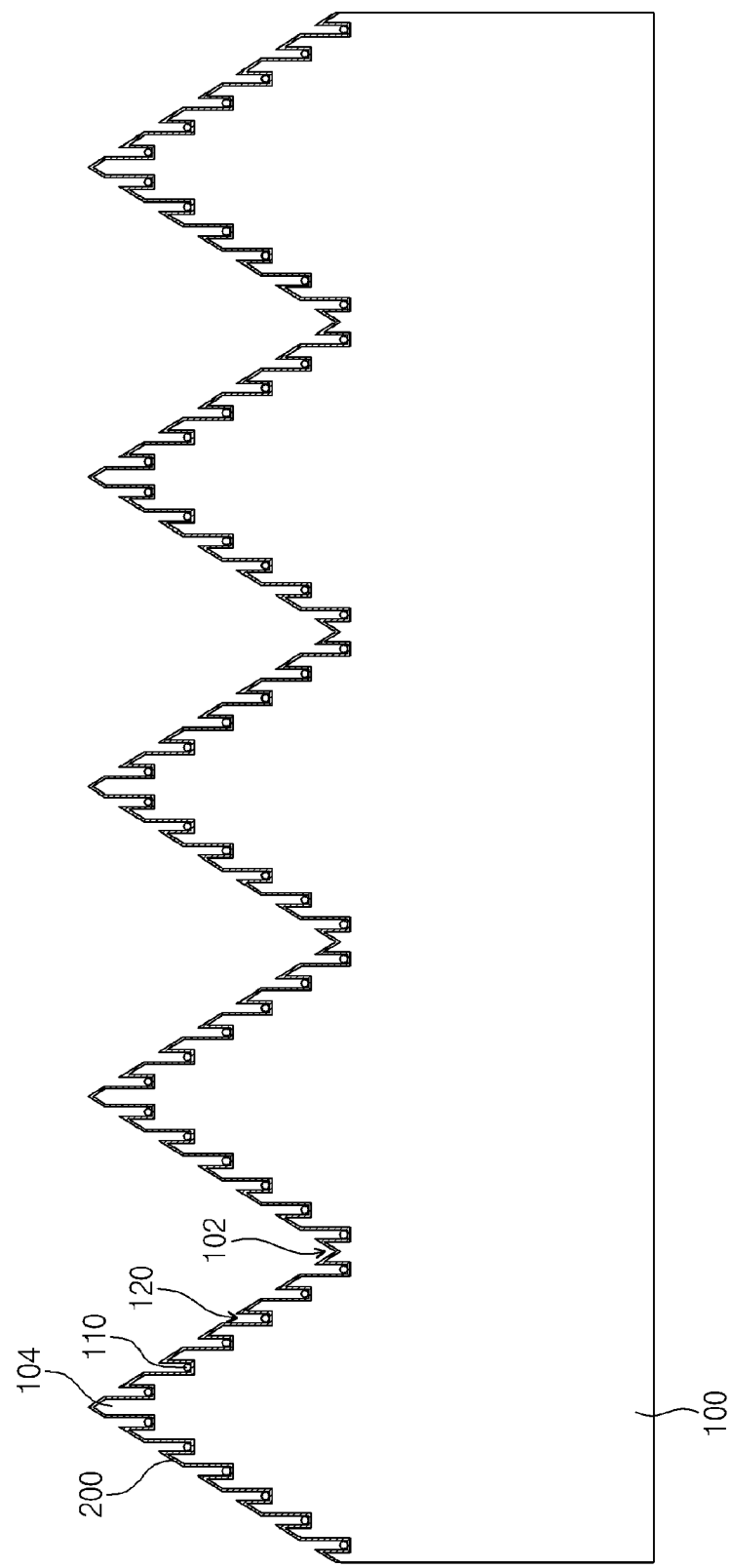
Figure 6:
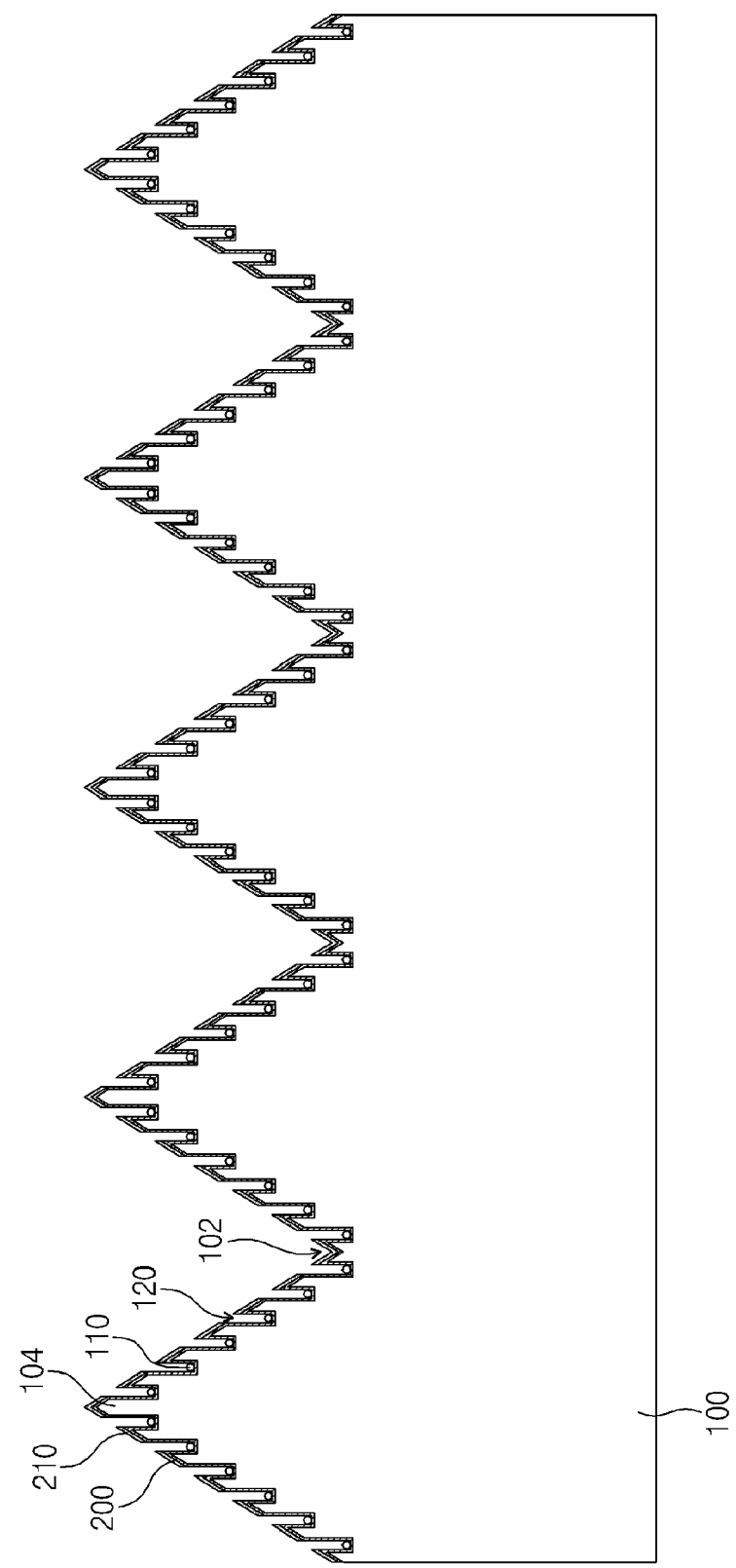
Figure 7:
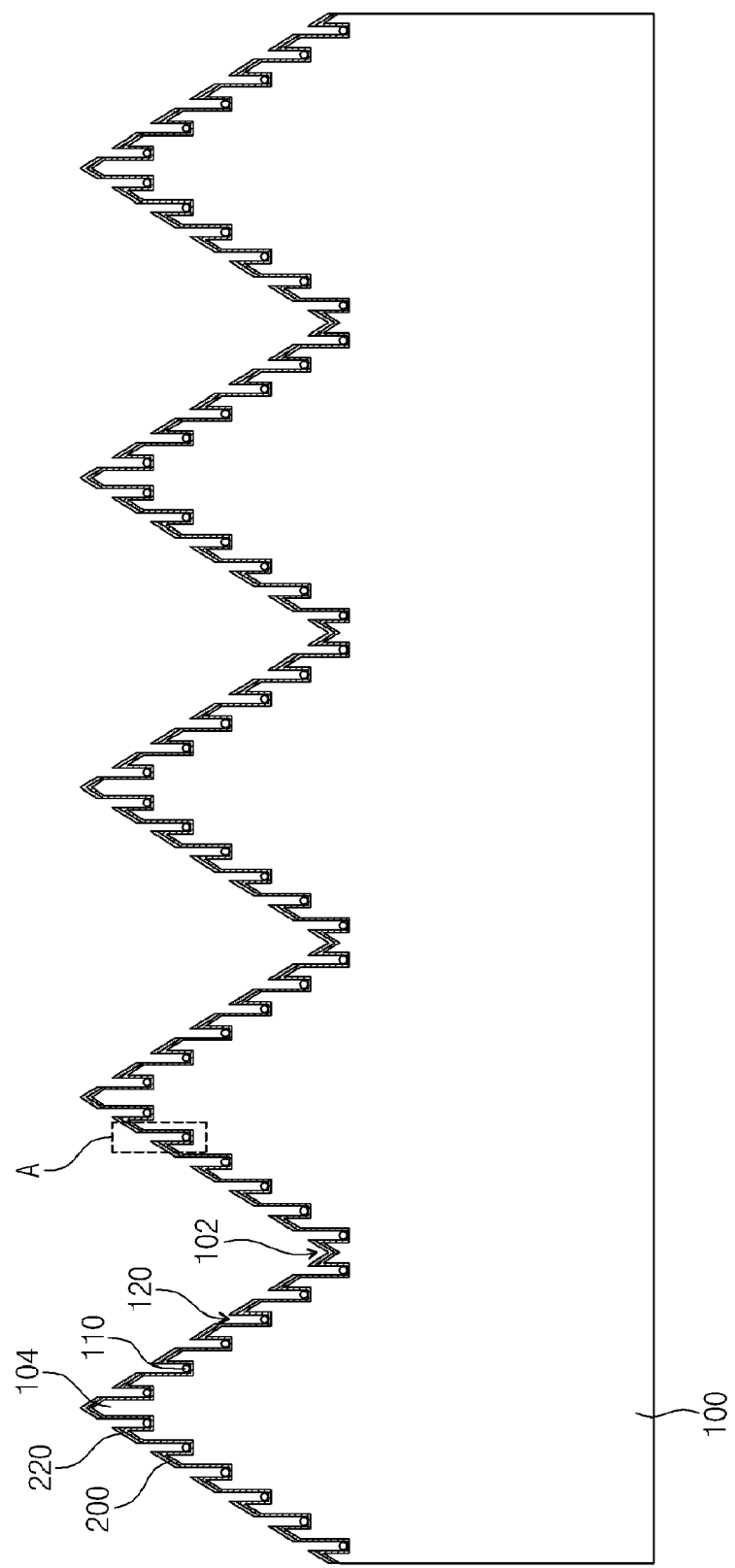
Figure 10:
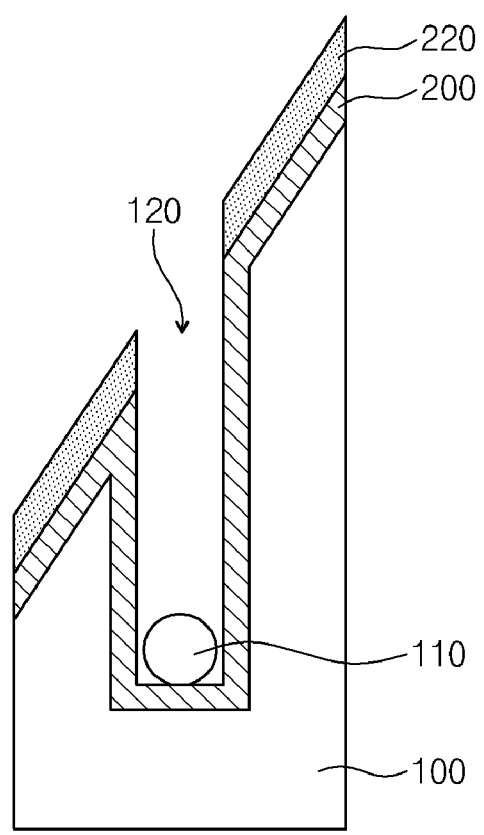
FIG. 10 is an enlarged view of a portion 'A' of FIG. 7.
Figure 11:
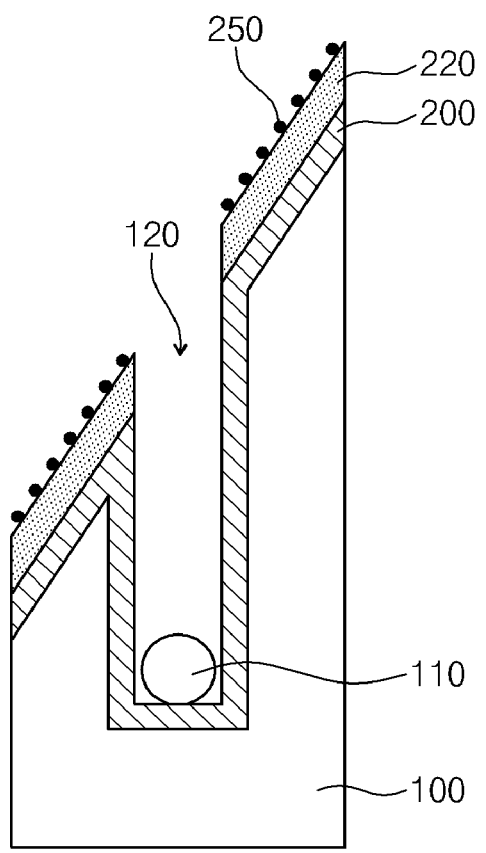
FIG. 11 is an enlarged view of a portion 'B' of FIG. 9.

FIG. 1 is a flowchart illustrating a method of fabricating a moisture and hydrogen adsorption getter according to some embodiments of the inventive concepts, and FIGS. 2 to 9 are cross-sectional views illustrating a method of fabricating a moisture and hydrogen adsorption getter according to some embodiments of the inventive concepts. FIG. 10 is an enlarged view of a portion 'A' of FIG. 7, and FIG. 11 is an enlarged view of a portion 'B' of FIG. 9.

Figure 2:
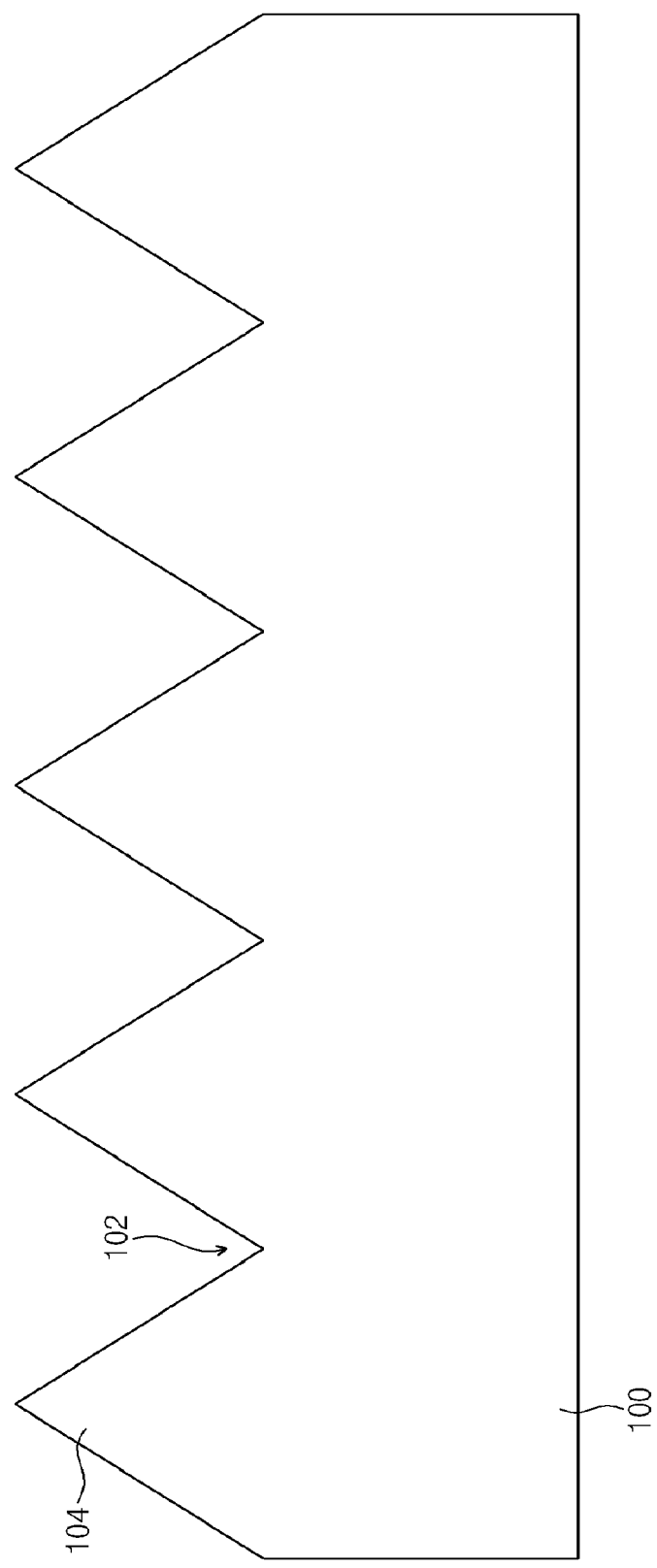
FIGS. 2 to 9 are cross-sectional views illustrating a method of fabricating a moisture and hydrogen adsorption getter according to some embodiments of the inventive concepts.

Referring to FIGS. 1 and 2, a silicon substrate 100 having a concave portion 102 and a convex portion 104 may be prepared (S110). The silicon substrate 100 may be a P-type silicon substrate used as a semiconductor material of, for example, an IR sensor.

The preparation of the silicon substrate 100 having the concave portion 102 and the convex portion 104 may include cleaning a base silicon substrate having a flat surface, and etching the cleaned base silicon substrate to form the silicon substrate 100 having the concave portion 102 and the convex portion 104.

The cleaning of the base silicon substrate may include removing impurities of the base silicon substrate, removing an organic material of the base silicon substrate, and removing a natural oxide layer of the base silicon substrate. For example, the impurities of the base silicon substrate may be removed using acetone and deionized water. For example, the removal of the organic material of the base silicon substrate may include immersing the base silicon substrate in a cleaning solution which has a temperature of 80° C. and includes sulfuric acid, hydrogen peroxide and deionized water mixed with each other at a ratio of 6:3:1, and cleaning the base silicon substrate by deionized water. For example, the removal of the natural oxide layer of the base silicon substrate may include immersing the base silicon substrate in a 10 wt % hydrofluoric acid solution for 10 minutes at room temperature.

The etching of the cleaned base silicon substrate may include immersing the cleaned base silicon substrate in a basic solution. For example, the basic solution may include at least one of KOH, $(CH_3)_4NOH$ (TMAH), or $NH_4F$. For example, the cleaned base silicon substrate may be immersed in a 2 wt % potassium hydroxide solution for 30 minutes to form the silicon substrate 100 having the concave portion 102 and the convex portion 104. Thereafter, the silicon substrate 100 having the concave portion 102 and the convex portion 104 may be cleaned using deionized water and then may be dried.

Alternatively, a compound semiconductor substrate, a plastic substrate or a glass substrate may be used instead of the silicon substrate 100.

Figure 3:
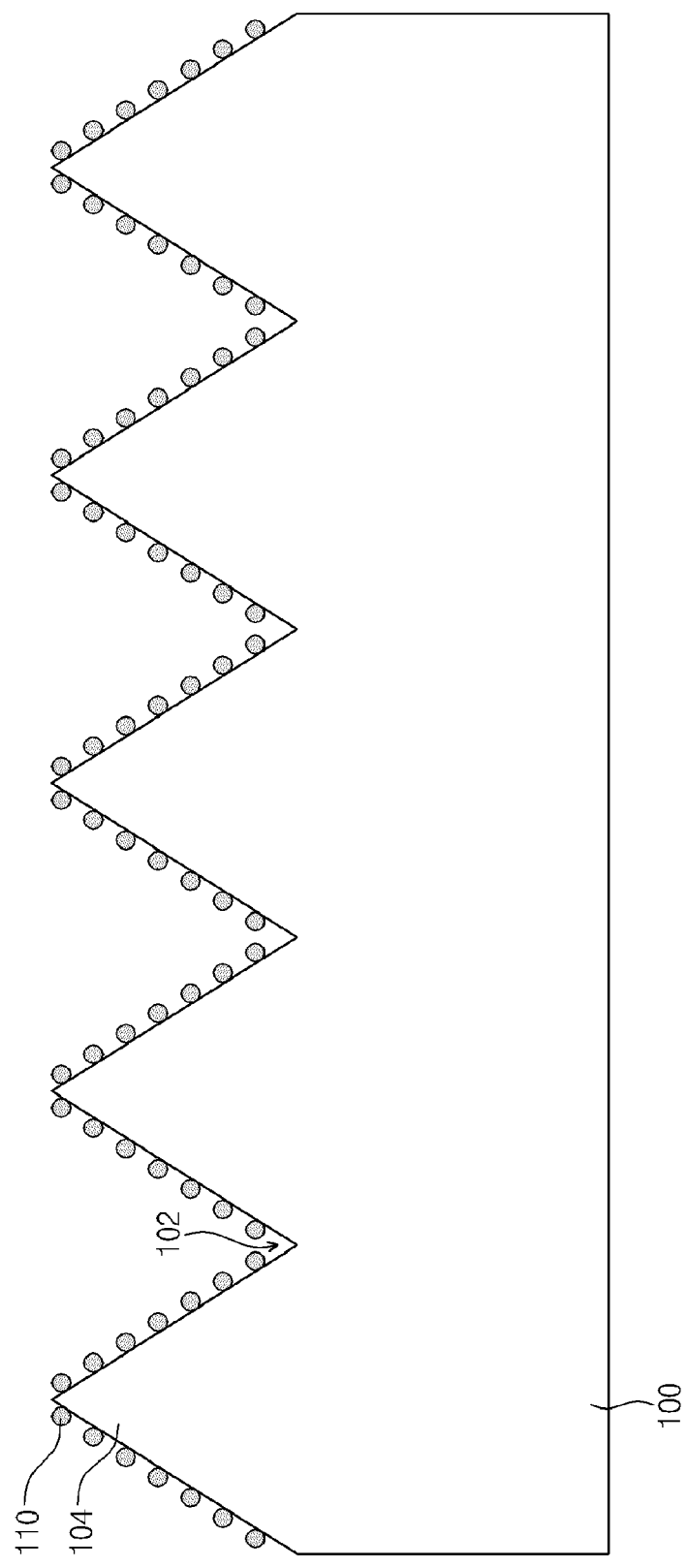

Referring to FIG. 3, metal particles 110 spaced apart from each other may be formed on the silicon substrate 100 having the concave portion 102 and the convex portion 104. The metal particles 110 may be formed on surfaces of the concave portion 102 and the convex portion 104 of the silicon substrate 100. For example, an average diameter of the metal particles 110 may be about 30 nm. For example, the metal particles 110 may include at least one of Pt, Ag, or Pd.

The formation of the metal particles 110 may include forming a metal thin layer on the silicon substrate 100 having the concave portion 102 and the convex portion 104, and thermally treating the metal thin layer to form the metal particles 110.

In some embodiments, the metal thin layer on the silicon substrate 100 having the concave portion 102 and the convex portion 104 may be formed by an electron-beam (e-beam) deposition method. In other embodiments, the metal thin layer may be formed by a chemical vapor deposition (CVD) method, a physical vapor deposition (PVD) method, or an atomic layer deposition (ALD) method.

The thermal treating of the metal thin layer to form the metal particles 110 may include thermally treating the metal thin layer to form the metal particles 110, and air-cooling the silicon substrate 100 to room temperature.

For example, when the metal thin layer is a platinum thin layer, the platinum thin layer may be formed with a thickness of about 10 nm and may be thermally treated at a temperature of 550° C. to 750° C. for 2 hours. In more detail, for example, when the platinum thin layer has the thickness of 10 nm and is thermally treated at 650° C., platinum particles having an average diameter of about 30 nm may be formed.

For another example, when the metal thin layer is a silver thin layer, the silver thin layer may be formed with a thickness of about 10 nm and may be thermally treated at a temperature of about 200° C. for 2 hours to form silver particles.

Figure 4:
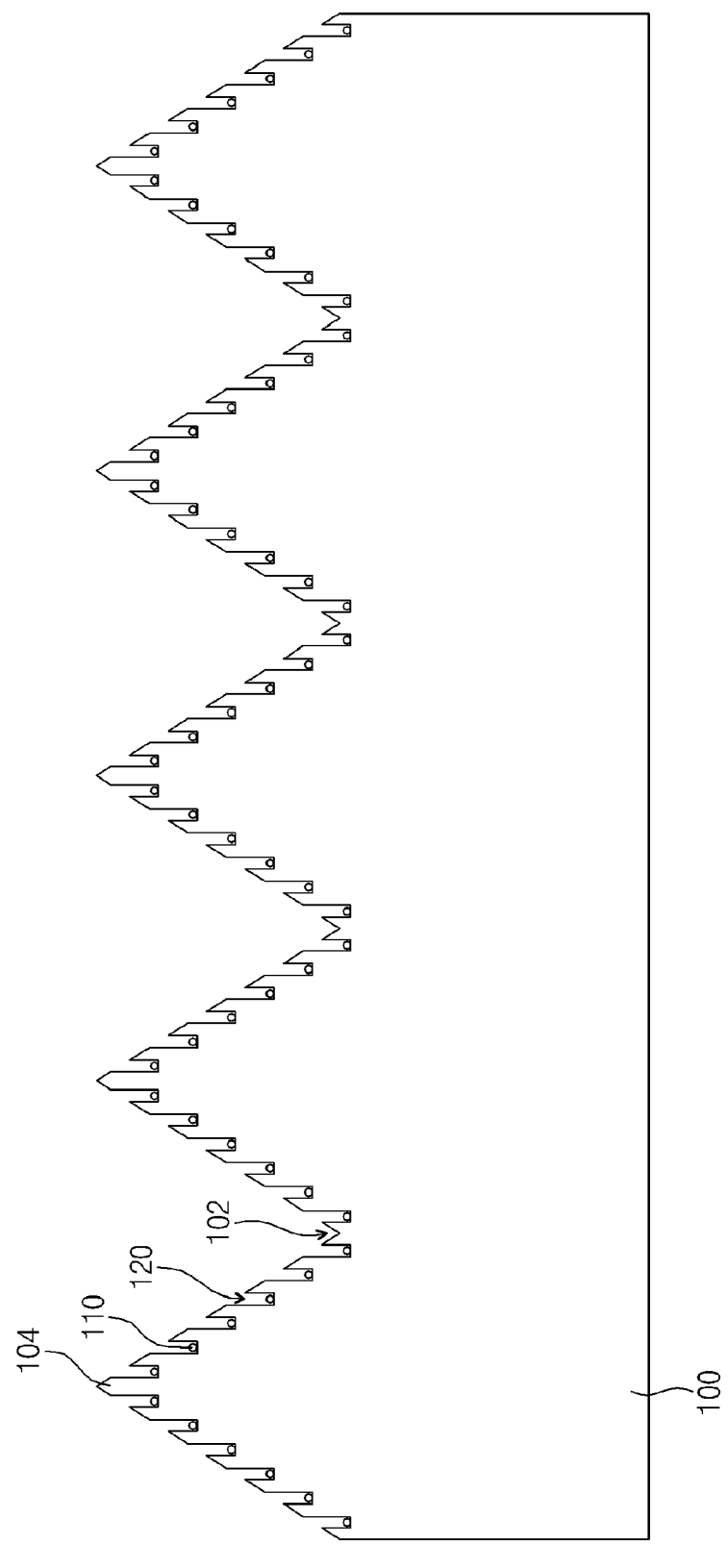

Referring to FIG. 4, a plurality of holes 120 may be formed to extend or be recessed downward from the surfaces of the concave portion 102 and the convex portion 104.

In some embodiments, the plurality of holes 120 may be formed by a metal-assisted chemical etching method using the metal particles 110. For example, when the platinum particles are formed on the surfaces of the concave portion 102 and the convex portion 104 as described above, the metal-assisted chemical etching method using the platinum particles may include etching the silicon substrate 100 using a HNA solution (HF:HNO$_3$:acetic acid:deionized water=3:5:3:22) at a temperature of 40° C. for 60 minutes.

If the etching process is performed using a solution including hydrofluoric acid and hydrogen peroxide unlike the above descriptions, it may be difficult to maintain the shapes of the concave portion 102 and the convex portion 104, due to high reactivity between hydrogen peroxide and the platinum particles.

However, according to the aforementioned embodiments of the inventive concepts, the plurality of holes 120 may be formed in the silicon substrate 100 having the concave portion 102 and the convex portion 104 by using the platinum particles and the HNA solution, and thus the shape of the silicon substrate 100 having the concave portion 102 and the convex portion 104 may be substantially maintained.

For another example, when the silver particles are formed on the surfaces of the concave portion 102 and the convex portion 104, a metal-assisted chemical etching method using the silver particles may include etching the silicon substrate 100 using a mixture solution of hydrofluoric acid and hydrogen peroxide (HF:H$_2$O$_2$=10:1) at room temperature for a time of 1 minute to 5 minutes. When the holes 120 are formed using the silver particles, the temperature of the thermal treatment process may be low, a material cost may be reduced, and a process time may be reduced.

Alternatively, in other embodiments, the plurality of holes 120 may be formed by an anode oxidation method. For example, the anode oxidation method may include applying a current of 1 mA/cm$^2$ using the silicon substrate 100 as an anode.

When the holes 120 are formed by the anode oxidation method, depths of the holes 120 may be adjusted depending on an applying time of the current and a kind and a ratio of a solution. In addition, the plurality of holes 120 may be formed at low temperature by a simple process, and thus a fabrication cost may be reduced.

Referring to FIGS. 1 and 5, the silicon substrate 100 which has the concave portion 102 and the convex portion 104 and in which the plurality of holes 120 is formed may be immersed in an acid solution to form a silicon oxide layer 200 for adsorbing moisture (S120). For example, the acid solution may include at least one of nitric acid or acetic acid.

The immersion of the silicon substrate 100 having the concave portion 102, the convex portion 104 and the holes 120 in the acid solution may include a first process of immersing the silicon substrate 100 in a first acid solution for a first time, and a second process of immersing the silicon substrate 100 for a second time longer than the first time in a second acid solution of which a temperature or a concentration is different from that of the first acid solution.

For example, the first immersion process may include immersing the silicon substrate 100 in a 40 wt % nitric acid solution of 110° C. for 10 minutes. For example, the second immersion process may include immersing the silicon substrate 100, on which the first immersion process is performed, in a 70 wt % nitric acid solution of 120° C. for 2 hours.

As described above, the silicon oxide layer 200 for adsorbing moisture may be formed by the simple solution process of immersing the silicon substrate 100 having the concave portion 102, the convex portion 104 and the holes 120 in the acid solution. Thus, the silicon oxide layer 200 may be conformally formed on inner surfaces of the holes 120 and a surface outside the holes 120. The surface outside the holes 120 may be referred to as an outer surface of the holes 120. When the acid solution is the nitric acid solution as described above, the silicon oxide layer 200 may be formed as the following chemical formula 1.

$$Si+4HNO_3 \rightarrow SiO_2+2H_2O+4NO_2 \qquad \text{[Chemical formula 1]}$$

However, if a moisture adsorbing layer is formed by a CVD method, a PVD method or an ALD method unlike the embodiments of the inventive concepts, it may not be easy to form the moisture adsorbing layer on the inner surfaces of the holes 120, due to a high aspect ratio of the holes 120. In addition, since a vacuum chamber is used, a fabrication cost may be increased and a fabricating process may be complicated.

However, according to the aforementioned embodiments of the inventive concepts, the silicon oxide layer 200 for adsorbing moisture may be formed by the simple solution process of immersing the silicon substrate 100 in the acid solution, and thus it is possible to provide the method of fabricating the moisture and hydrogen adsorption getter, which is capable of reducing the fabrication cost and of simplifying the fabricating processes.

The metal particles 110 may remain in the holes 120.

Referring to FIG. 6, a hydrogen adsorption preliminary pattern 210 may be formed on the silicon oxide layer 200. For example, the hydrogen adsorption preliminary pattern 210 may include at least one of Pd, Rh, or Pt. For example, the hydrogen adsorption preliminary pattern 210 may be formed by an e-beam deposition method, a CVD method, a PVD method, or an ALD method.

According to some embodiments of the inventive concepts, the hydrogen adsorption preliminary pattern 210 may be mainly formed on the outer surface of the plurality of holes 120 by the high aspect ratio of the holes 120. Thus, portions of the silicon oxide layer 200 which are disposed on the inner surfaces of the holes 120 may not be covered by the hydrogen adsorption preliminary pattern 210, but another portion of the silicon oxide layer 200 which is disposed on the outer surface of the holes 120 may be covered by the hydrogen adsorption preliminary pattern 210. In other words, the silicon oxide layer 200 on the inner surfaces of the holes 120 may be exposed. Moisture may be easily adsorbed by the silicon oxide layer 200 which is disposed on the inner surfaces of the holes 120 and thus is exposed.

Referring to FIGS. 1, 7 and 10, a hydrogen adsorption pattern 220 may be formed on the silicon oxide layer 200 (S130). The silicon oxide layer 200 for adsorbing moisture may be exposed between portions of the hydrogen adsorption pattern 220.

The hydrogen adsorption pattern 220 may be formed by thermally treating the hydrogen adsorption preliminary pattern 210. For example, when the hydrogen adsorption preliminary pattern 210 is formed of palladium, a palladium pattern of 100 nm may be deposited by an e-beam deposition method, and the palladium pattern may be thermally treated at 300° C. to form the hydrogen adsorption pattern 220 including palladium oxide. When the hydrogen adsorption pattern 220 includes the palladium oxide, the palladium oxide may adsorb hydrogen as the following chemical formula 2.

PdO(s)+H$_2$(g)→Pd(s)+H$_2$O(l)  [Chemical formula 2]

Unlike the embodiments described above, the process of thermally treating the hydrogen adsorption preliminary pattern 210 may be omitted. In this case, the hydrogen adsorption preliminary pattern 210 may adsorb hydrogen.

Figure 8:
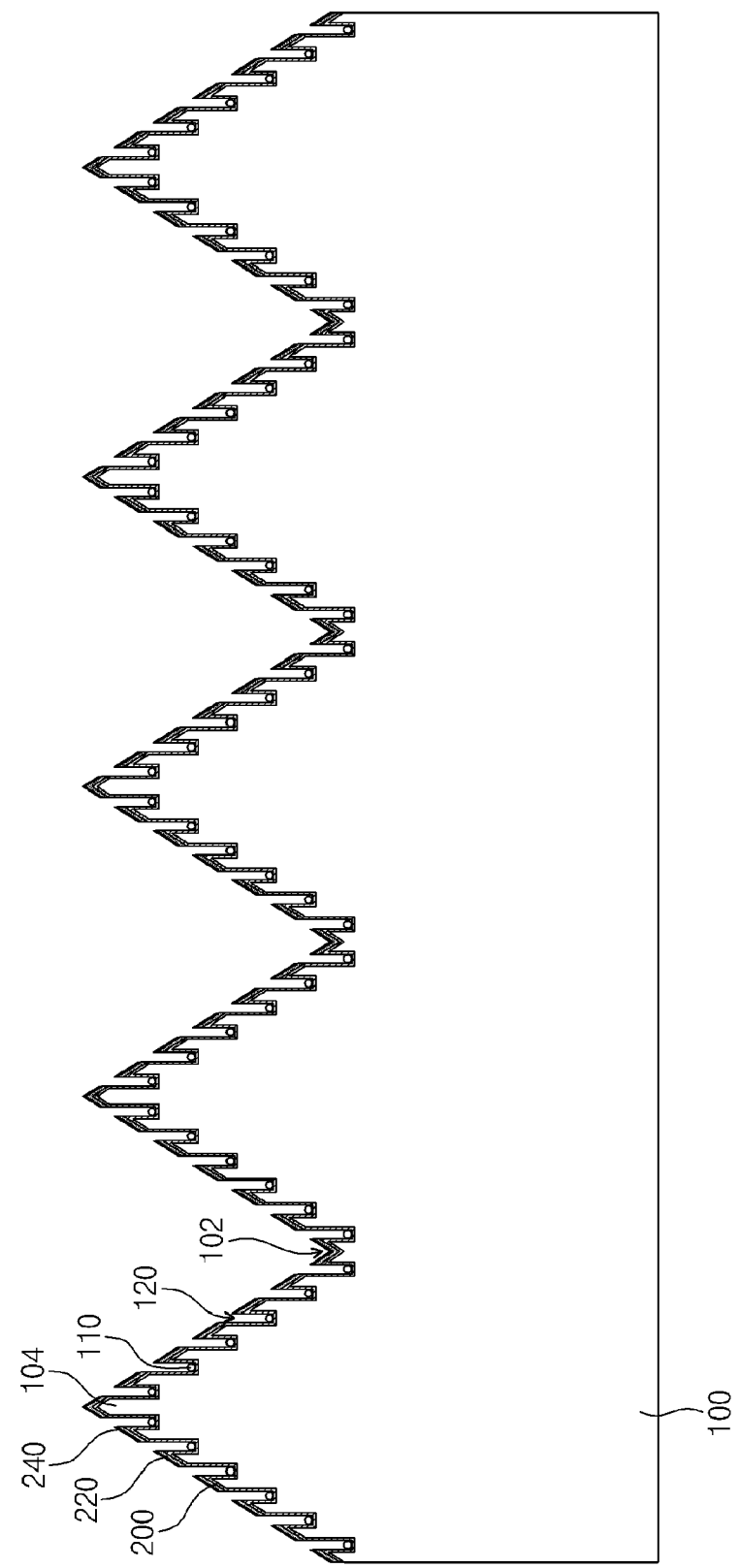

Referring to FIG. 8, a passivation layer 240 may be formed on the hydrogen adsorption pattern 220.

In some embodiments, the passivation layer 240 may be formed using an e-beam deposition method. In other embodiments, the passivation layer 240 may be formed by a CVD method, a PVD method, or an ALD method. For example, the passivation layer 240 may include at least one of Ag, Pd, or Pt.

The passivation layer 240 may be deposited on the hydrogen adsorption pattern 220 and may cover the silicon oxide layer 200 and the hydrogen adsorption pattern 220 to inhibit the hydrogen adsorption pattern 220 and the silicon oxide layer 200 from being exposed to an external environment. Thus, the hydrogen adsorption pattern 220 and the silicon oxide layer 200 may be protected. For example, the passivation layer 240 may protect the hydrogen adsorption pattern 220 and the silicon oxide layer 200 from various post-treatment processes (e.g., a process exposed to the atmosphere, a cleaning process, a plasma process, and/or a high-pressure process) performed before the moisture and hydrogen adsorption getter including the silicon oxide layer 200 and the hydrogen adsorption pattern 220 is coupled to an electronic device.

Figure 9:
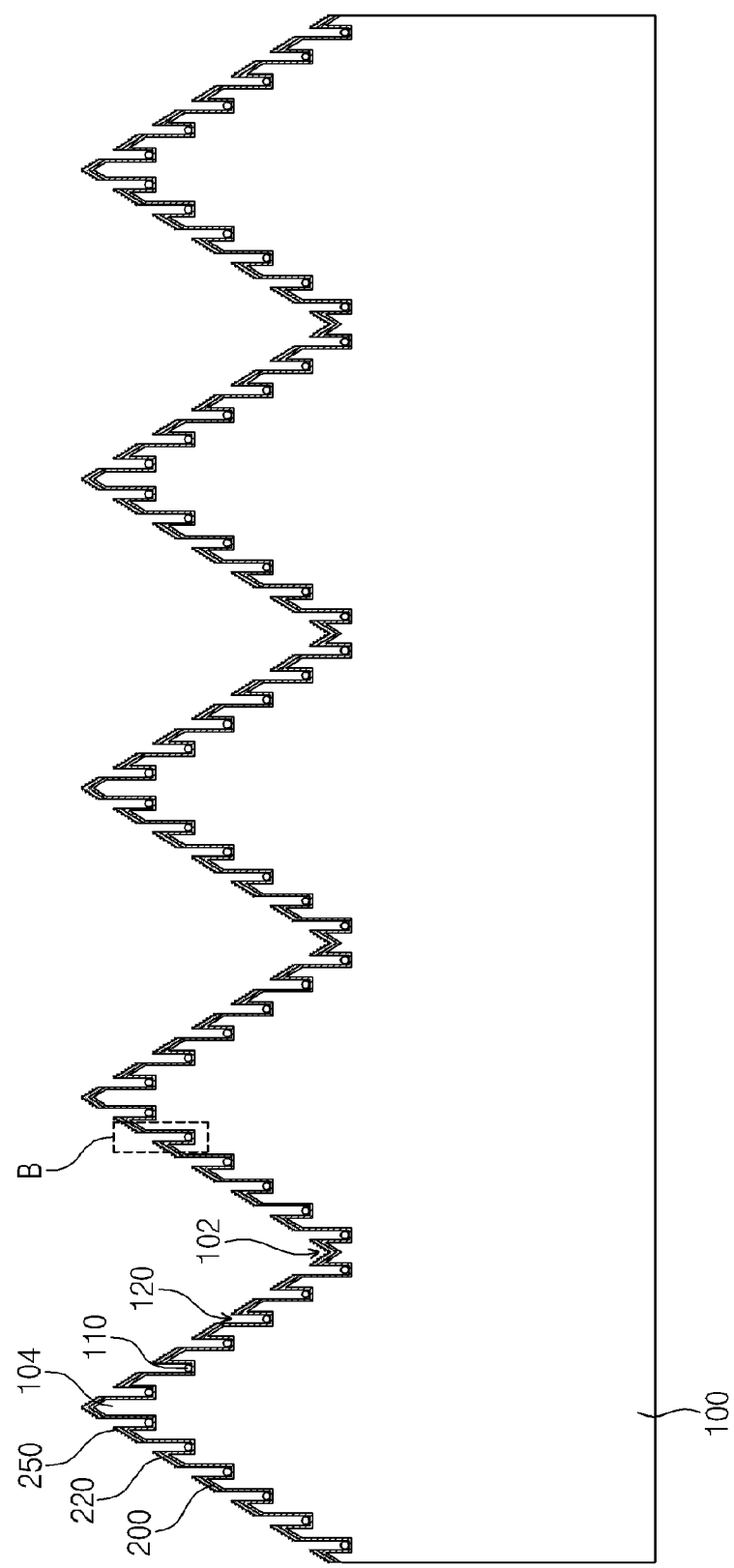

Referring to FIGS. 1, 9 and 11, passivation metal catalyst particles 250 may be formed on the hydrogen adsorption pattern 220 (S140).

The passivation metal catalyst particles 250 may be formed by thermally treating the passivation layer 240. For example, when the passivation layer 240 is a silver thin layer, the silver thin layer may be deposited with a thickness of 10 nm and then may be thermally treated at 300° C. to form silver catalyst particles.

According to some embodiments, the hydrogen adsorption pattern 220 may be exposed between the passivation metal catalyst particles 250.

The passivation metal catalyst particles 250 may improve characteristics of the hydrogen adsorption pattern 220 and the silicon oxide layer 200 in such a way that the hydrogen adsorption pattern 220 and the silicon oxide layer 200 easily adsorb hydrogen and moisture under a high-vacuum condition.

In addition, a temperature at which the passivation layer 240 is thermally treated to form the passivation metal catalyst particles 250 may be substantially equal to or similar to a temperature of a process of adhering the getter including the silicon oxide layer 200 and the hydrogen adsorption pattern 220 to the electronic device and a temperature of a process of cleaning the electronic device and the getter. Thus, an additional thermal treatment process for forming the passivation metal catalyst particles 250 from the passivation layer 240 may be omitted.

According to other embodiments of the inventive concepts, the formation of the passivation layer 240 and the passivation metal catalyst particles 250 may be omitted.

According to the embodiments of the inventive concepts, the moisture and hydrogen adsorption getter including the hydrogen adsorption pattern 220 and the silicon oxide layer 200 for adsorbing moisture may be coupled to the electronic device to prevent the electronic device from being deteriorated by moisture and hydrogen. Hereinafter, this will be described in detail with reference to FIGS. 12 and 13.

Figure 12:
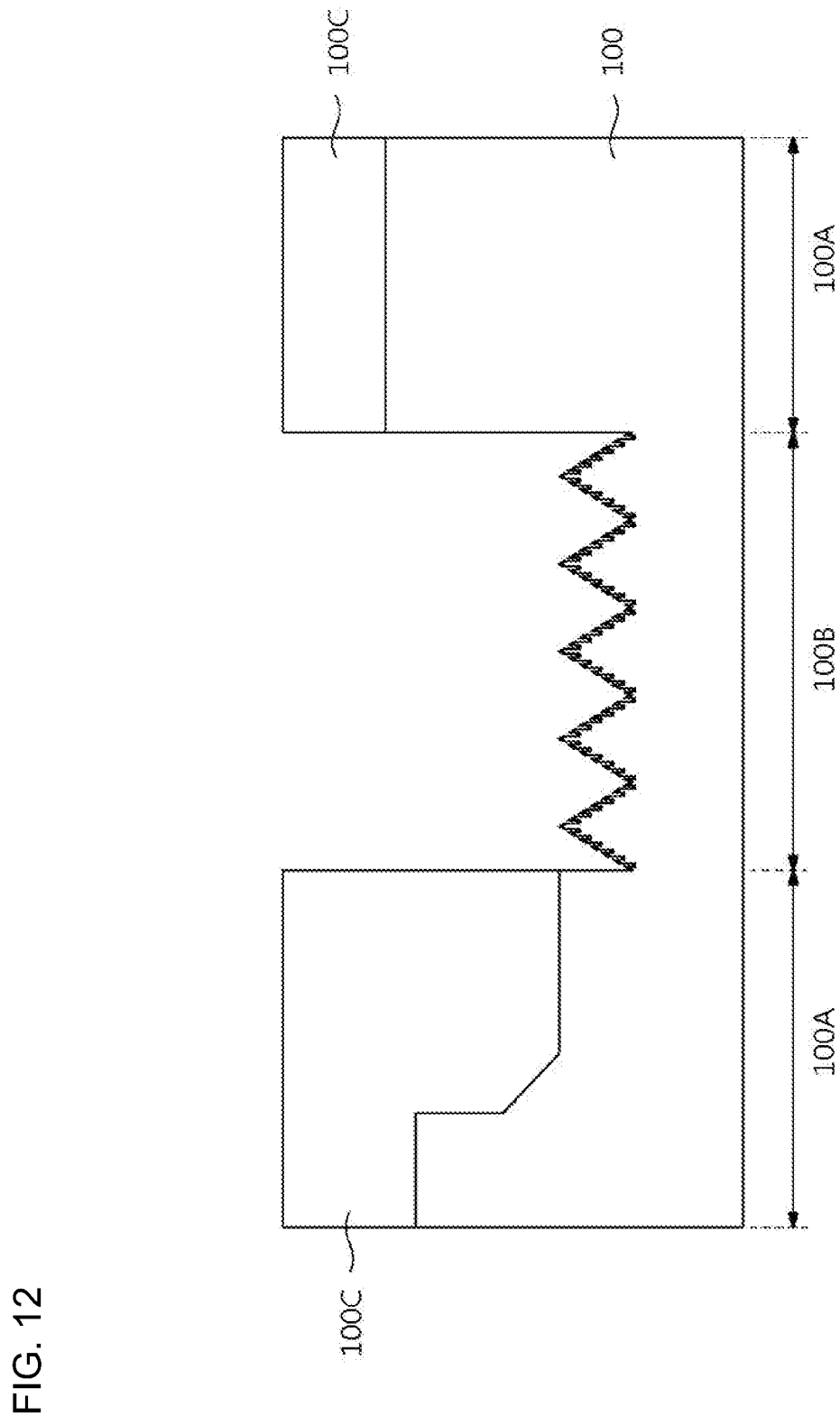
FIG. 12 is a view illustrating a moisture and hydrogen adsorption getter formed in a region of a silicon substrate in some embodiments of the inventive concepts.

FIG. 12 is a view illustrating a moisture and hydrogen adsorption getter formed in a region of a silicon substrate in some embodiments of the inventive concepts.

Referring to FIG. 12, the silicon substrate 100 described with reference to FIGS. 1 to 11 may include a first region 100A covered by a mask film 100C and a second region 100B not covered by the mask film 100C. The concave portion 102, the convex portion 104, the plurality of holes 120, the silicon oxide layer 200 for adsorbing moisture, the hydrogen adsorption pattern 220 and the passivation metal catalyst particles 250, which are described with reference to FIGS. 1 to 11, may be formed on the second region 100B of the silicon substrate 100.

Thus, the preparation of the silicon substrate 100, described with reference to FIGS. 1 and 2, may include forming the mask film 100C on the first region 100A of the silicon substrate 100 to expose the second region 100B of the silicon substrate 100, and immersing the silicon substrate 100 in the basic solution to form the concave portion 102 and the convex portion 104, described in FIGS. 1 to 11, on the second region 100B of the silicon substrate 100.

After the formation of the concave portion 102 and the convex portion 104, the plurality of holes 120, the silicon oxide layer 200 for adsorbing moisture, the hydrogen adsorption pattern 220 and the passivation metal catalyst particles 250 may be sequentially formed as described with reference to FIGS. 1 to 11. The mask film 100C may be removed after the formation of the passivation metal catalyst particles 250.

After the moisture and hydrogen adsorption getter is formed on the second region 100B described with reference to FIG. 12, the moisture and hydrogen adsorption getter may be coupled to the electronic device. Hereinafter, this will be described with reference to FIG. 13.

Figure 13:
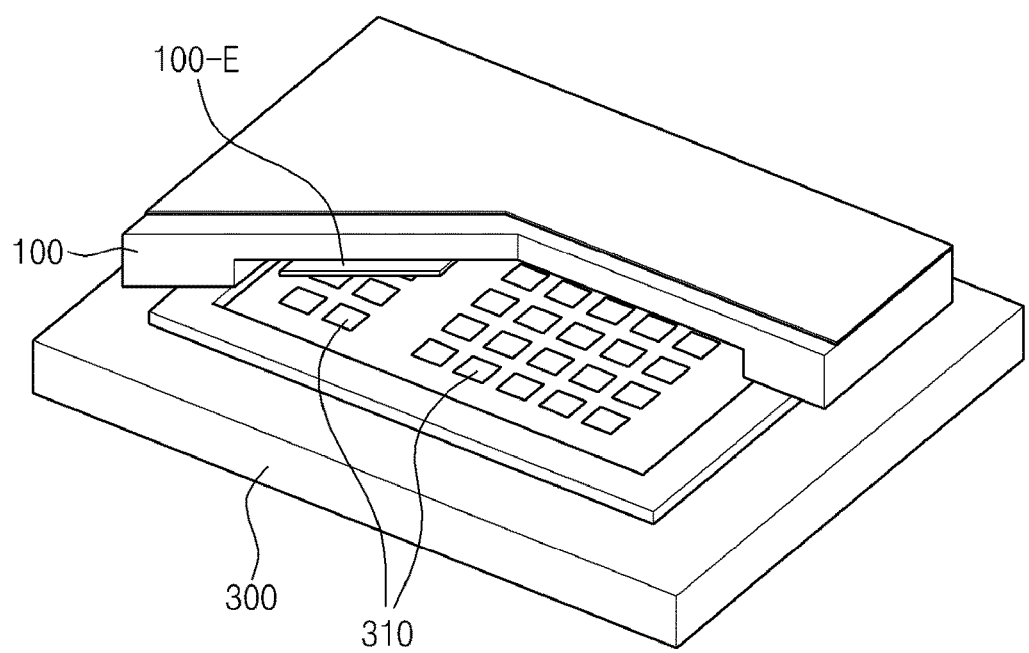
FIG. 13 is a perspective view illustrating an electronic device including a moisture and hydrogen adsorption getter according to some embodiments of the inventive concepts.

FIG. 13 is a perspective view illustrating an electronic device including a moisture and hydrogen adsorption getter according to some embodiments of the inventive concepts.

Referring to FIG. 13, the electronic device in which the moisture and hydrogen adsorption getter is used may include a device substrate 300 having a sensor part 310, and the silicon substrate 100 including the moisture and hydrogen adsorption getter 100E fabricated as described with reference to FIGS. 1 to 12.

In some embodiments, the device substrate 300 may be coupled to the silicon substrate 100 in such a way that the sensor part 310 faces the silicon oxide layer 200 and the hydrogen adsorption pattern 220.

Thus, the silicon oxide layer 200 may adsorb moisture, and the hydrogen adsorption pattern 220 may adsorb hydrogen. As a result, it is possible to inhibit the sensor part 310 from being deteriorated by moisture and hydrogen.

In the embodiment of FIG. 13, the device substrate 300 having the sensor part 310 is coupled to the silicon substrate 100 including the moisture and hydrogen adsorption getter 100E fabricated according to FIGS. 1 to 12 in the electronic device. However, embodiments of the inventive concepts are not limited thereto. In other embodiments, the moisture and hydrogen adsorption getter 100E may be coupled to at least one of other various devices such as memory devices and application processors (APs).

Detailed experimental examples of the method of fabricating the moisture and hydrogen adsorption getter according to the embodiments of the inventive concepts will be described hereinafter.

Figure 14:
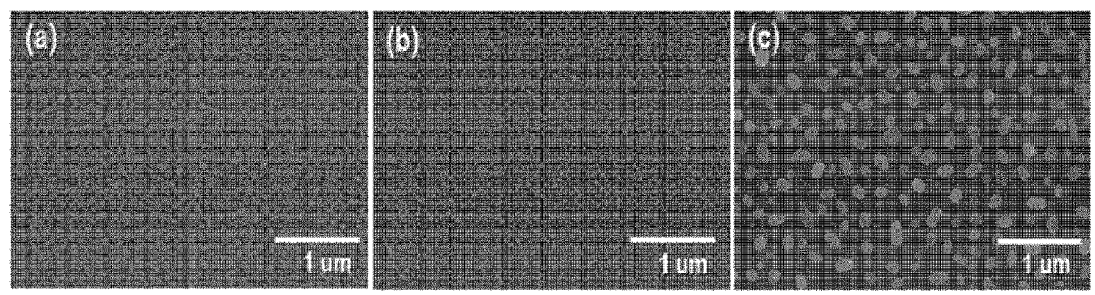
FIG. 14 shows scanning electron microscope (SEM) images of platinum particles formed in a method of fabricating a moisture and hydrogen adsorption getter according to some embodiments of the inventive concepts.

FIG. 14 shows scanning electron microscope (SEM) images of platinum particles formed in a method of fabricating a moisture and hydrogen adsorption getter according to some embodiments of the inventive concepts.

Referring to FIG. 14, a P-type silicon substrate was prepared. Impurities of the silicon substrate were removed using acetone and deionized water. In addition, the silicon substrate was immersed in a cleaning solution (80° C.) including sulfuric acid, hydrogen peroxide and deionized water mixed with each other at a ratio of 6:3:1 and then was cleaned by deionized water, and thus an organic material of the silicon substrate was removed. Furthermore, the silicon substrate was immersed in a 10 wt % hydrofluoric acid solution at room temperature for 10 minutes to remove a natural oxide layer of the silicon substrate.

Thereafter, the silicon substrate from which the impurities, the organic material and the natural oxide layer were removed was immersed in a 2 wt % potassium hydroxide solution for 30 minutes to form a concave portion and a convex portion according to the embodiments of the inventive concepts.

Subsequently, a platinum thin layer having a thickness of 10 nm was formed on the concave portion and the convex portion by an e-beam deposition method.

Thereafter, the platinum thin layers were thermally treated at 550° C., 650° C., and 750° C., respectively, to form platinum particles. SEM images (a), (b) and (c) of FIG. 14 show the platinum particles formed by thermally treating the platinum thin layers at 550° C., 650° C., and 750° C., respectively.

As shown in the SEM image (a) of FIG. 14, when the platinum thin layer is thermally treated at 550° C., the platinum particle is not easily formed. As shown in the SEM image (c) of FIG. 14, when the platinum thin layer is thermally treated at 750° C., coarse platinum particles are formed. As shown in the SEM image (b) of FIG. 14, when the platinum thin layer is thermally treated at 650° C., the platinum particles having an average diameter of about 30 nm are uniformly formed. Thus, the platinum thin layer may be thermally treated at a temperature greater than 550° C. and less than 750° C. to effectively form the platinum particles.

Figure 15:
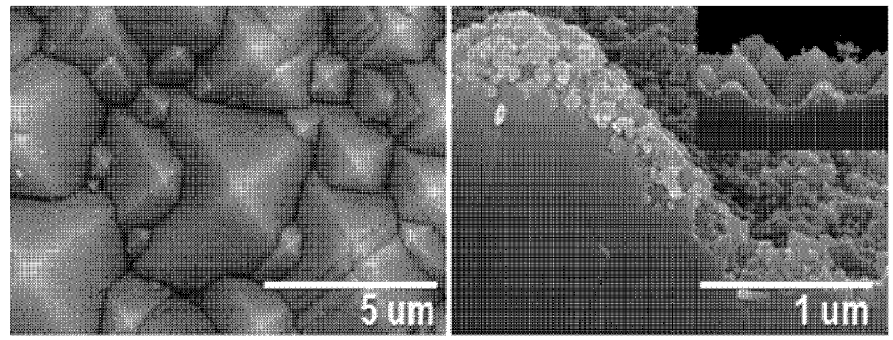
FIG. 15 shows SEM images of a plurality of holes formed using platinum particles in a method of fabricating a moisture and hydrogen adsorption getter according to some embodiments of the inventive concepts.

FIG. 15 shows SEM images of a plurality of holes formed using platinum particles in a method of fabricating a moisture and hydrogen adsorption getter according to some embodiments of the inventive concepts.

Referring to FIG. 15, a plurality of holes was formed in the silicon substrate by using the platinum particles formed by thermally treating the platinum thin layer at 650° C. in the method described with reference to FIG. 14. In detail, the silicon substrate including the concave portion and the convex portion on which the platinum particles were formed was etched using a HNA solution (HF:HNO$_3$:acetic acid:deionized water=3:5:3:22) at 60° C. for 6 hours to form the holes having depths of about 100 nm.

Figure 16:
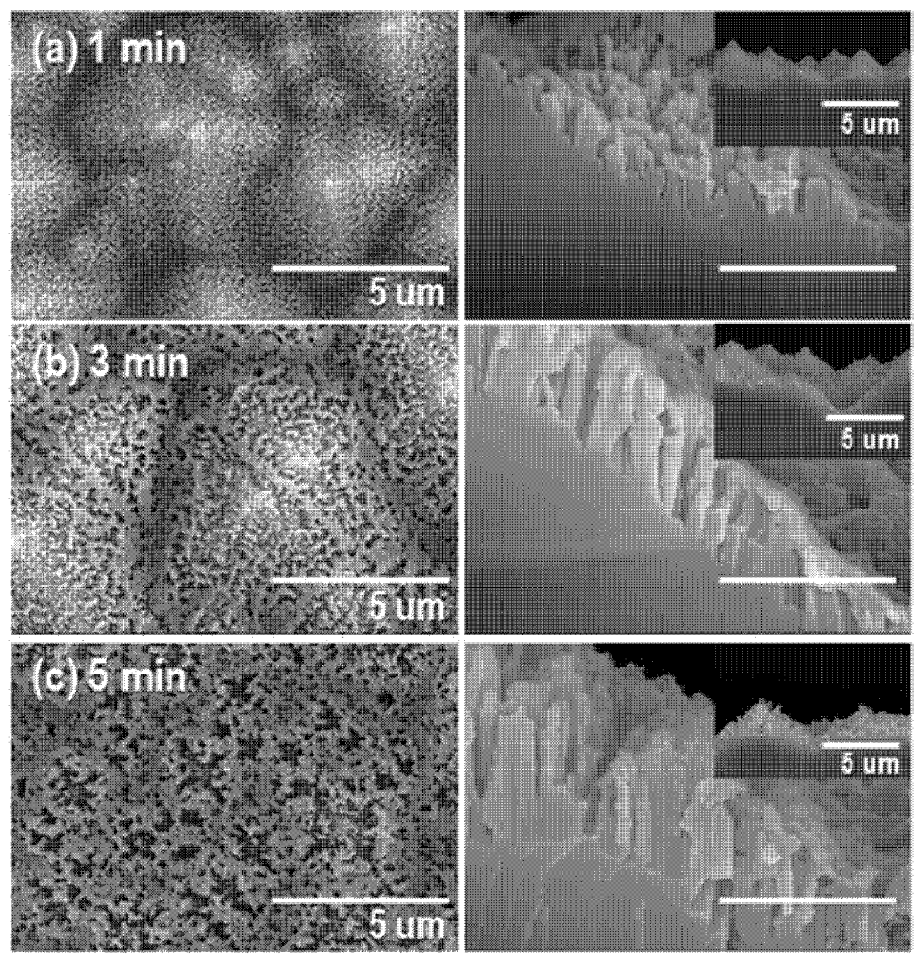
FIG. 16 shows SEM images of a plurality of holes formed using silver particles in a method of fabricating a moisture and hydrogen adsorption getter according to some embodiments of the inventive concepts.

FIG. 16 shows SEM images of a plurality of holes formed using silver particles in a method of fabricating a moisture and hydrogen adsorption getter according to some embodiments of the inventive concepts.

Referring to FIG. 16, silver particles were formed on the silicon substrate cleaned and dried by the method described with reference to FIG. 14, and a plurality of holes was formed in the silicon substrate by using the silver particles. A silver thin layer having a thickness of about 10 nm was deposited on the silicon substrate by an e-beam deposition method, and then, the deposited silver thin layer was thermally treated at 200° C. for 2 hours to form the silver particles.

The silicon substrates were etched using a solution (hydrofluoric acid:hydrogen peroxide=10:1) at room temperature for 1 minute, 3 minutes, and 5 minutes, respectively, thereby forming the holes using the silver particles. SEM images (a), (b) and (c) of FIG. 16 show the holes formed by etching the silicon substrates having the silver particles for 1 minute, 3 minutes, and 5 minutes, respectively.

As shown in the SEM image (a) of FIG. 16, when the silicon substrate having the silver particles is etched for 1 minute, the holes are not easily formed. As shown in the SEM image (c) of FIG. 16, when the silicon substrate having the silver particles is etched for 5 minutes, structures of the holes collapse. As shown in the SEM image (b) of FIG. 16, when the silicon substrate having the silver particles is etched for 3 minutes, the holes having appropriate depths are formed. Thus, the silicon substrate may be etched using the silver particles for a time greater than 1 minute and less than 5 minutes to effectively form the plurality of holes.

Figure 17:
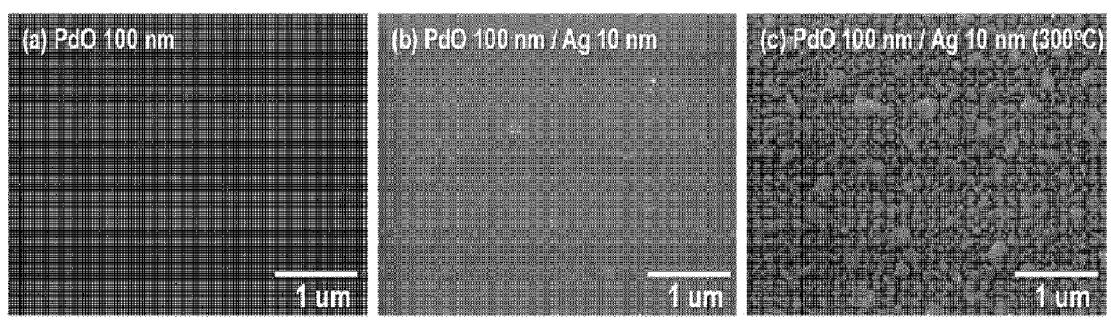
FIG. 17 shows SEM images of a hydrogen adsorption pattern and a passivation metal catalyst particle formed in a method of fabricating a moisture and hydrogen adsorption getter according to some embodiments of the inventive concepts.

FIG. 17 shows SEM images of a hydrogen adsorption pattern and a passivation metal catalyst particle formed in a method of fabricating a moisture and hydrogen adsorption getter according to some embodiments of the inventive concepts.

Referring to FIG. 17, a silicon oxide layer was formed on the silicon substrate including the concave portion, the convex portion and the holes, formed by the methods described with reference to FIGS. 14 and 15. A palladium layer having a thickness of about 100 nm was deposited as a hydrogen adsorption preliminary pattern on the silicon oxide layer by an e-beam deposition method, and then, the deposited palladium layer was thermally treated at 300° C. to form palladium oxide corresponding to a hydrogen adsorption pattern. A SEM image (a) of FIG. 17 was obtained from the palladium oxide.

A silver layer having a thickness of about 10 nm was deposited as a passivation layer on the palladium oxide, and then, a SEM image (b) of FIG. 17 was obtained from the silver layer.

The silver layer deposited on the palladium oxide was thermally treated at 300° C. to form silver particles as passivation metal catalyst particles, and a SEM image (c) of FIG. 17 was obtained from the silver particles.

Figure 18:
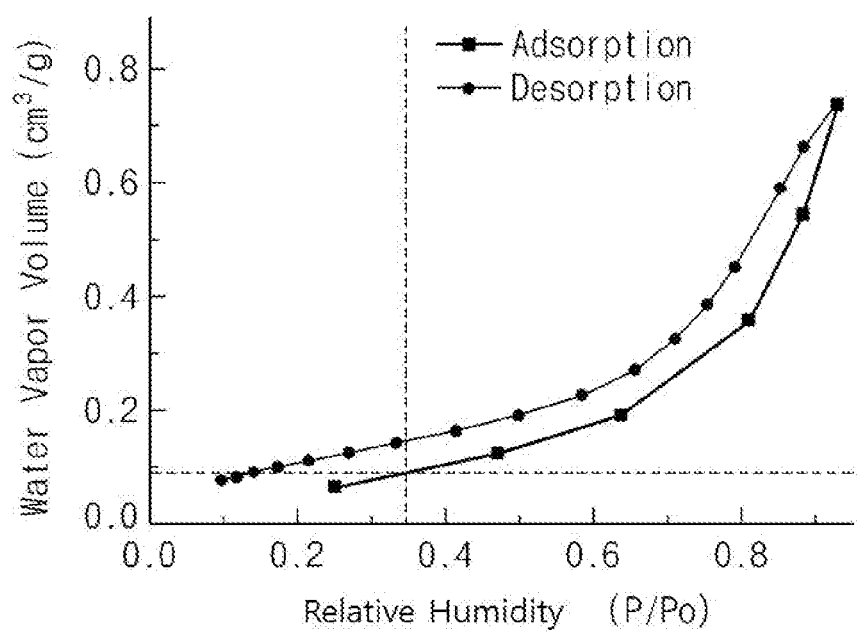
FIG. 18 is a graph showing evaluated moisture adsorption characteristics of a moisture and hydrogen adsorption getter according to some embodiments of the inventive concepts.

FIG. 18 is a graph showing evaluated moisture adsorption characteristics of a moisture and hydrogen adsorption getter according to some embodiments of the inventive concepts.

Referring to FIG. 18, moisture adsorption characteristics of a moisture and hydrogen adsorption getter which included the hydrogen adsorption pattern including the palladium oxide and the silicon oxide layer for adsorbing moisture formed by the method described with reference to FIG. 17 were evaluated.

The moisture and hydrogen adsorption getter was heated at 300° C. for 24 hours in a vacuum to remove moisture and a gas which remained in the moisture and hydrogen adsorption getter, and then, the moisture adsorption characteristic evaluation of the moisture and hydrogen adsorption getter was performed using tertiary deionized water which had a density of 0.997 g/cm$^3$ and a saturated vapor pressure of 3.1690 kPa (23.8 mmHg) and was heated to 80° C.

In addition, the moisture adsorption characteristic evaluation of the moisture and hydrogen adsorption getter was measured while maintaining a temperature of 25.15° C. At this time, an apparatus for the measurement was a BEL-SORP-aqua3 of the BEL Japan company, and isothermal adsorption and desorption curves of the moisture and hydrogen adsorption getter were obtained by a volume method as shown in FIG. 18.

A moisture adsorption capacity is generally based on a volume value of moisture adsorbed under a condition of relative humidity of 35%, and a moisture adsorption capacity value of the moisture and hydrogen adsorption getter including the silicon oxide layer according to the inventive concepts was 6.251%. Thus, the silicon oxide layer may be usable as a moisture getter material.

Figure 19:
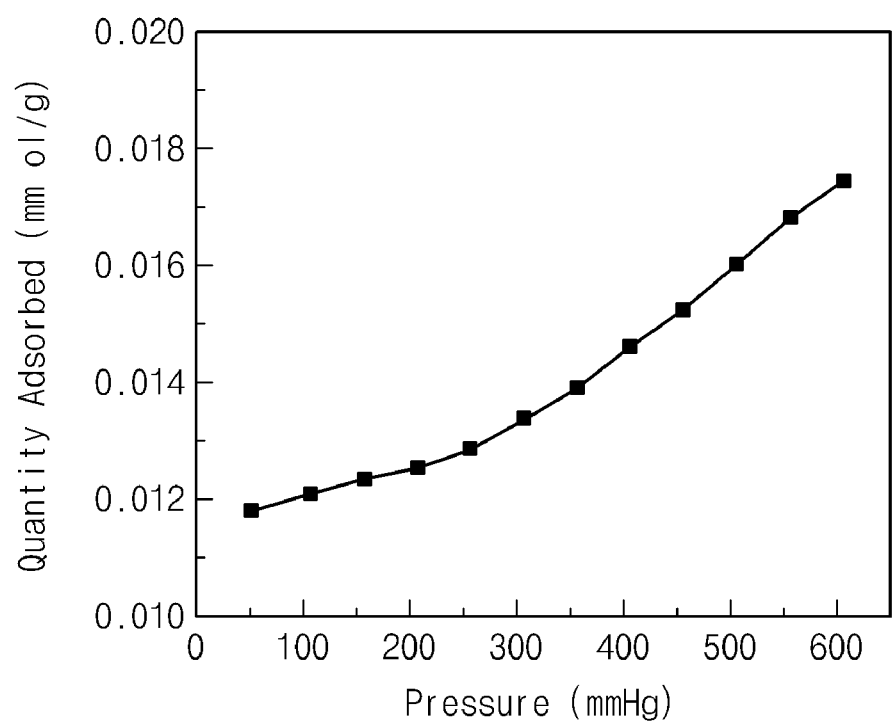
FIG. 19 is a graph showing evaluated hydrogen adsorption characteristics of a moisture and hydrogen adsorption getter according to some embodiments of the inventive concepts.

FIG. 19 is a graph showing evaluated hydrogen adsorption characteristics of a moisture and hydrogen adsorption getter according to some embodiments of the inventive concepts.

Referring to FIG. 19, hydrogen adsorption characteristics of the moisture and hydrogen adsorption getter which included the hydrogen adsorption pattern including the palladium oxide and the silicon oxide layer for adsorbing moisture formed by the method described with reference to FIG. 17 were evaluated.

The moisture and hydrogen adsorption getter was heated at 90° C. for 30 minutes in a vacuum and was heated at 300° C. for 4 hours in a vacuum to remove moisture and a remaining gas in the moisture and hydrogen adsorption getter, and then, the hydrogen adsorption characteristic evaluation of the moisture and hydrogen adsorption getter was performed at room temperature. As a result of this evaluation, the hydrogen adsorption characteristics of 0.01 mmol/g or more are shown in an entire pressure range without an additional activation process, as shown in FIG. 19. Thus, the hydrogen adsorption pattern including the palladium oxide may be usable as a hydrogen getter material.

The moisture and hydrogen adsorption getter according to the embodiments of the inventive concepts may be coupled to various electronic devices (e.g., sensors, memory devices, and/or CPU) to inhibit or prevent the electronic devices from being deteriorated by moisture and hydrogen.

The moisture and hydrogen adsorption getter according to the embodiments of the inventive concepts may include the substrate including the concave portion and the convex portion, the silicon oxide layer conformally provided along the surfaces of the concave portion and the convex portion and configured to adsorb moisture, and the hydrogen adsorption pattern disposed on the silicon oxide layer. A portion of the silicon oxide layer may be exposed between portions of the hydrogen adsorption pattern, and thus moisture as well as hydrogen may be easily adsorbed. In addition, the silicon oxide layer may be formed by the method of immersing the substrate including the concave and convex portions in the acid solution. Thus, the fabricating processes of the moisture and hydrogen adsorption getter may be simplified, and the fabrication cost thereof may be reduced.

Moreover, according to the embodiments of the inventive concepts, the moisture and hydrogen adsorption getter may include the plurality of holes extending downward from the surfaces of the concave portion and the convex portion. The silicon oxide layer may be formed by the method of immersing the substrate in the acid solution as described above, and thus the silicon oxide layer may be conformally formed along the inner surfaces of the holes. As a result, a surface area of the silicon oxide layer for adsorbing moisture may be increased. In addition, even though the hydrogen adsorption pattern is formed on the silicon oxide layer, a portion of the silicon oxide layer may be exposed, and thus it is possible to provide the moisture and hydrogen adsorption getter of which adsorption rates of moisture and hydrogen are improved.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of fabricating a moisture and hydrogen adsorption getter, the method comprising:
   preparing a silicon substrate including a concave portion and a convex portion;
   forming a plurality of holes extending downward from surfaces of the concave portion and the convex portion, wherein a plurality of metal particles is provided in the plurality of holes,
   forming a silicon oxide layer for adsorbing moisture; and
   forming a hydrogen adsorption pattern on the silicon oxide layer.

2. A method of fabricating a moisture and hydrogen adsorption getter, the method comprising:

preparing a silicon substrate including a concave portion and a convex portion;

forming a plurality of holes extending downward from surfaces of the concave portion and the convex portion, wherein a plurality of metal particles is provided in the plurality of holes, forming a silicon oxide layer for adsorbing moisture by immersing the silicon substrate in an acid solution; and forming a hydrogen adsorption pattern on the silicon oxide layer.

3. The method of claim 2, further comprising:

forming a plurality of holes extending downward from surfaces of the concave portion and the convex portion before the forming of the silicon oxide layer.

4. The method of claim 2, wherein the preparing of the silicon substrate comprises:

forming a mask film that covers a first region of the silicon substrate and exposes a second region of the silicon substrate; and immersing the silicon substrate in a basic solution to form the concave portion and the convex portion on the second region of the silicon substrate.

5. The method of claim 2, wherein the forming of the hydrogen adsorption pattern comprises:

forming a hydrogen adsorption preliminary pattern on the silicon oxide layer; and oxidizing the hydrogen adsorption preliminary pattern by a thermal treatment method to form the hydrogen adsorption pattern.

6. A method of fabricating a moisture and hydrogen adsorption getter, the method comprising:

preparing a silicon substrate including a concave portion and a convex portion;

forming a silicon oxide layer for adsorbing moisture by immersing the silicon substrate in an acid solution; and forming a hydrogen adsorption pattern on the silicon oxide layer, forming a plurality of holes extending downward from surfaces of the concave portion and the convex portion before the forming of the silicon oxide layer, wherein the forming of the holes comprises:

forming a metal thin layer on the concave portion and the convex portion;

thermally treating the metal thin layer formed on the concave portion and the convex portion to form metal particles; and forming the holes extending downward from the surfaces corresponding to the metal particles by a method of etching the silicon substrate including the concave portion and the convex portion by using the metal particles as a catalyst.

7. A method of fabricating a moisture and hydrogen adsorption getter, the method comprising:

preparing a silicon substrate including a concave portion and a convex portion;

forming a silicon oxide layer for adsorbing moisture by immersing the silicon substrate in an acid solution;

forming a hydrogen adsorption pattern on the silicon oxide layer; and forming passivation metal catalyst particles on the hydrogen adsorption pattern, wherein the forming of the passivation metal catalyst particles comprises:

forming a metal catalyst pattern on the hydrogen adsorption pattern; and thermally treating the metal catalyst pattern to form the passivation metal catalyst particles.

* * * * *